United States Patent [19]

LoCascio et al.

[11] 4,297,646
[45] Oct. 27, 1981

[54] CURRENT MIRROR CIRCUIT

[75] Inventors: James J. LoCascio, Mesa; Robert B. Jarrett, Tempe, both of Ariz.

[73] Assignee: Motorola Inc., Schaumburg, Ill.

[21] Appl. No.: 115,522

[22] Filed: Jan. 25, 1980

[51] Int. Cl.³ .............................................. H03F 3/14
[52] U.S. Cl. .................................... 330/288; 323/316
[58] Field of Search ................ 330/257, 288; 307/297, 307/299 B; 323/315, 316

[56] References Cited

U.S. PATENT DOCUMENTS 3,566,289 2/1971 Cope .................................. 330/288

OTHER PUBLICATIONS

Gray et al., *Analysis and Design of Analog Integrated Circuits*, pp. 208-210, 1977, Wiley and Sons.

*Primary Examiner*—James B. Mullins
*Attorney, Agent, or Firm*—Michael D. Bingham

[57] ABSTRACT

A three terminal current source is disclosed including a current turn around circuit comprising first and second transistors. The emitters of the pair of transistors are coupled to a common terminal with the collector of the first one of the pair of the transistors being coupled to an input terminal at which is supplied a reference current with the collector of the other one of the pair of transistors being coupled in cascode through the emitter collector path of an output transistor to the output terminal of the current source circuit. The base electrodes of the pair of transistors are directly connected to each other with the control electrode of the output transistor being connected to the collector of the first one of the pair of transistors of the current turn around circuit. A single lateral split collector transistor is utilized to improve the current match between the input and output of the current source wherein the emitter of this transistor is connected to the base electrodes of the pair of transistors of the current source with one collector and the base of the split collector transistor being connected to the collector of the second one of the pair of transistors. The other one of the collectors of the split collector transistor is connected directly to the output terminal of the current source. The aforedescribed structure provides a current source having improved matching characteristics over a temperature range which varies from $-40°$ C. to $+125°$ C.

10 Claims, 1 Drawing Figure

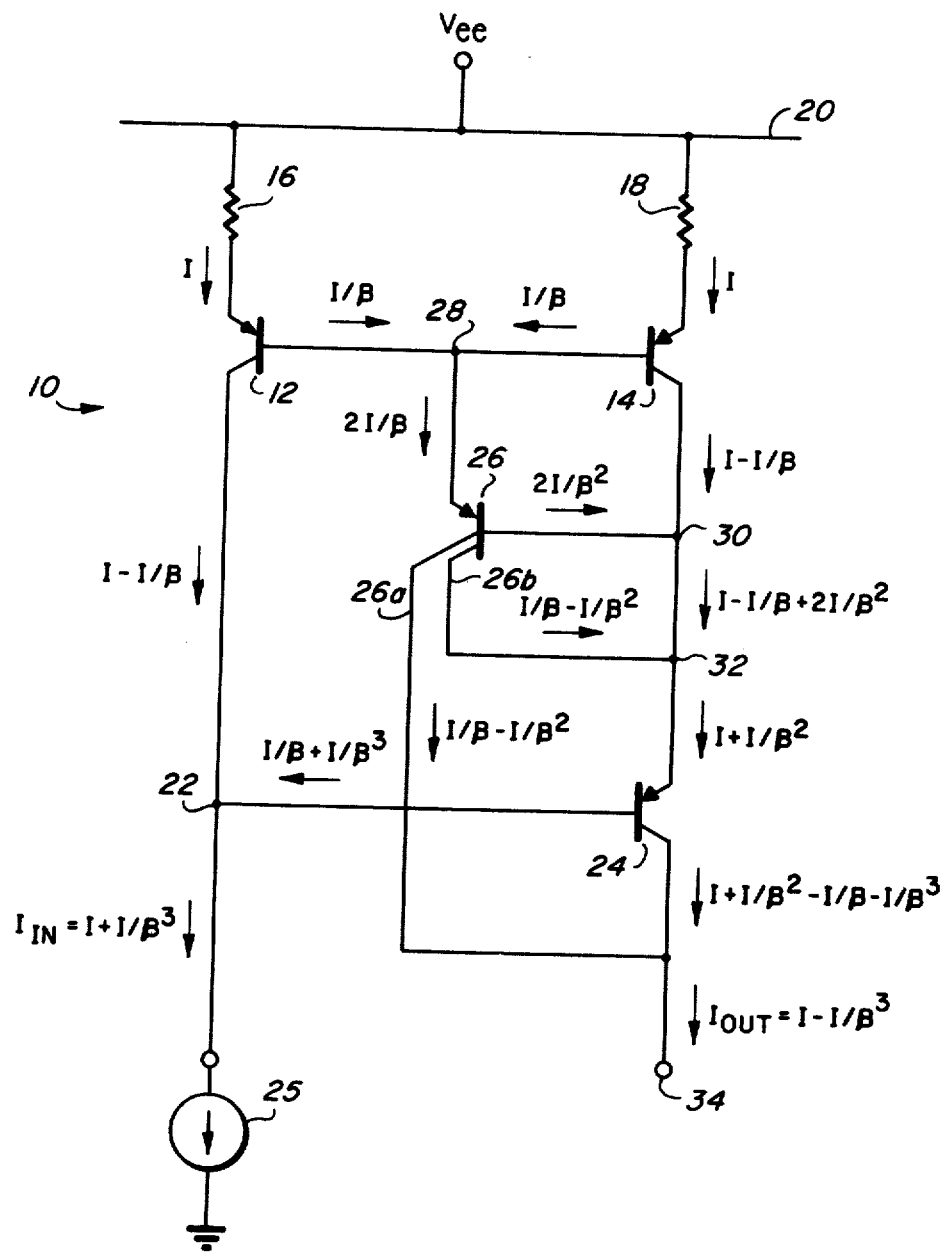

CURRENT MIRROR CIRCUIT

BACKGROUND OF THE INVENTION

This invention relates to current mirror circuits and more particularly to an improved transistor circuit suitable for fabrication in integrated circuit form and including additional structure for producing an output current closely matched in magnitude to an input current provided to the current mirror.

Current mirror or current source circuits are well known in the art. Many contemporary current mirror circuits suitable for fabrication in integrated circuit form are considered three terminal circuits comprising an input terminal at which a source of input current is provided; a common terminal at which an operating potential is supplied; and an output terminal to which a load may be connected and at which an output current, substantially equal in magnitude to that of the input current, is provided.

Many of the prior art circuits are comprised of a well known current turn around circuit including a pair of transistors wherein a source of current for establishing the input current is connected to the collector of one of the two transistors. The bases of the two transistors are directly connected to each other and the input current is substantially reproduced at the collector of the second transistor as the output current.

Most, if not all, of the prior art circuits have been concerned with improving the matching between the input and the output current, i.e., improving the ratio of the input current to the output current. However, using lateral PNP transistors, many of these prior art circuits exhibit poor matching, especially when worst case lateral PNP transistor betas (where beta is the forward current gain of the transistor) are considered. Thus, a need exists for providing minimal structure for improving the match between the input and the output current of an integrated current mirror circuit.

SUMMARY OF THE INVENTION

Accordingly, it is an object of the present invention to provide an improved current mirror having an improved current matching performance.

Another object of the present invention is to provide a current mirror circuit wherein the current match between the input and output current provided thereby is improved by utilizing a single, split collector lateral transistor.

In accordance with the foregoing and other objects there is provided a current mirror circuit suitable for fabrication in monolithic integrated circuit form comprising a current turn around circuit including first and second transistors and which has a common terminal; an input terminal; an output terminal; and a source of input current coupled to the input terminal of the current turn around circuit with the common terminal thereof being coupled to a source of operating potential. The output terminal is coupled in cascode through an output transistor which has its control electrode coupled to the source of current and its output electrode connected to the output of the current mirror to provide thereat an output current substantially matched in magnitude with that of the input current. The emitters of the pair of transistors in the current turn around circuit are coupled to the common terminal and the base electrodes are directly coupled to each other. The collector of one of the pair of transistors is connected to the input terminal with the collector of the other transistor being connected to the output terminal of the current turn around circuit.

A feature of the present invention includes a split collector lateral PNP transistor having the emitter base path thereof coupled between the base and collector of the second one of the pair of transistors in the current turn around circuit. A first collector of the split collector lateral PNP transistor is connected to the output terminal of the current turn around circuit with the second one of the collectors of the split collector transistor being connected directly to the output terminal of the current mirror circuit. This split collector lateral transistor aids in producing an output current at the output terminal of the current mirror circuit which is essentially equal to the input current supplied by the source of current.

BRIEF DESCRIPTION OF THE DRAWING

The single FIGURE shows the current mirror circuit of an embodiment of the present invention.

DETAILED DESCRIPTION OF THE PREFERRED EMBODIMENT

The single Figure shows a current mirror or current source 10 which is suitable to be fabricated in monolithic integrated circuit form. As shown, all of the transistors of current source 10 may be laterally formed PNP transistors. Current source 10 includes PNP transistors 12, 14 comprising a current turn around circuit that is well known in the art. The emitters of transistors 12, 14 are coupled via resistors 16, 18, respectively to power supply conductor 20 at which is supplied operating potential $V_{EE}$. The collector of transistor 12 is connected at node 22 to the base of an output PNP transistor 24 which has the emitter thereof connected to the collector of transistor 14. A source of input current 25 is shown connected to node 22 and provides a reference current that is the combination of the collector current from transistor 12 and the base current from transistor 24. The base electrodes of transistors 12 and 14 are directly connected to each other and are connected at node 28 to the emitter of split collector lateral PNP transistor 26. The base and collector 26b of transistor 26 are connected to the collector of transistor 14. The collector of transistor 24 as well as collector 26a of transistor 26 is coupled directly to output terminal 34 of current source 10 at which is provided the output current $I_{OUT}$. As shown, current source 10 comprises a three terminal device having a common terminal at which is supplied the voltage $V_{EE}$, an input terminal (22) at which is supplied $I_{IN}$ and an output terminal 34 at which is provided $I_{OUT}$.

The inclusion of a single split collector transistor 26 to the current source 10 produces the output current $I_{OUT}$ which is substantially matched to the input current $I_{IN}$ even considering worst case lateral PNP transistor betas. To show the improved matching between the ratio of $I_{IN}$ to $I_{OUT}$, respective currents are shown in the single Figure wherein the beta amplification factor of each of the individual devices is taken into account. The assumption is made that the currents supplied to the emitters of transistors 12 and 14 are identical in value and are equal to the magnitude I. The currents appearing at the collectors of transistors 12 and 14 are shown as being equal to the emitter current I minus a value equal to the base current which is equal to the value of the fraction $I/\beta$. The base current drive from transistors 12 and 14 provide the emitter current of split collector transistor 26 such that at the split collectors thereof there is produced a collector current equal to the fraction $1/\beta - 1/\beta^2$ which is the collector current of this device minus its base current. The base current for transistor 26 is shown as being equal to the value of 2 $I/\beta^2$. The collector current from collector 26b sums with the base current of transistor 26 at nodes 30 and 32 with the collector current from transistor 14 to produce a current that is supplied to the emitter of transistor 24 equal to the term $I + I/\beta^2$. The base current of transistor 24 which is substracted from the value of its emitter current is shown as being equal to the fraction $I/\beta - + I/\beta^3$. The base current drive of transistor 24 when summed with the collector current from transistor 12, at node 22, makes up the reference current source $I_{IN}$ and is equal to the term $I + I/\beta^3$. The collector from transistor 24 is summed at output terminal 34 with the collector current from collector 26a to produce an output current $I_{OUT}$ equal to $I - I/\beta^3$. From the above discussion, the ratio of $I_{IN}$ to $I_{OUT}$, which is a measure of the accuracy of current mirror 10, is equal to the fraction:

$$\frac{1 + \frac{I}{\beta^3}}{1 - \frac{I}{\beta^3}}$$

For an example, if for the worst case the value for beta of the transistors of current source 10 is equal to 5, it can be shown that an error of 1.6% is produced between a ratio of the input current to the output current. In fact, in a working model built to the above specification a ratio of $I_{IN}$ to $I_{OUT}$ of less than 2% was maintained over a temperature range from $-40°$ to C. $+125°$ C.

What has been shown then is an improved current source wherein a single split collector lateral PNP transistor has been included in a conventional current mirror circuit to provide improved matching currents when considering worse case current amplification factor for the transistors comprising the current source.

We claim:
1. A current mirror, comprising:
   current turn around means for supplying first, second and third currents at respective outputs, said current turn around means being coupled to a terminal which is adapted to receive an operating potential;
   current source means coupled to a first one of said outputs of said current turn around means for supplying an input current thereto;
   output electron control means having a first, a second and a control electrode, said first electrode being connected to a second one of said outputs of said current turn around means, said second electrode being coupled to an output terminal of the current mirror, said control electrode being coupled to said current source means; and
   first electron control means having first, second, third and control electrodes, said first electrode being coupled to a third one of said outputs of said current turn around means, said second electrode being coupled to said output terminal of the current mirror, and said third and control electrodes each being coupled to said first electrode of said output electron control means.

2. The current mirror of claim 1 wherein said current turn around means includes:
   second electron control means having first, second and control electrodes, said first electrode being coupled to said terminal supplied an operating potential, said second electrode being coupled to said first output of said current turn around means, said control electrode being coupled to said third one of said current turn around means; and
   third electron control means having first, second and control electrodes, said first electrode being coupled to said terminal supplied an operating potential, said second electrode being coupled to said second one of said outputs of said current turn around means and said control electrode being coupled to said third one of said outputs of said current turn around means.

3. The current mirror of claim 2 wherein said first, second, third and output electron control means being PNP transistors.

4. The current mirror of claim 3 wherein the first electrodes being emitter electrodes of said PNP transistors, said second electrodes being collector electrodes, said control electrodes being base electrodes, respectively.

5. A current mirror circuit suitable for manufacture in integrated circuit form, comprising:
   first electron control means having first, second and control electrodes, said first electrode being coupled to a first terminal which is adapted to receive a source of operating potential, said second electrode being coupled to a second terminal which is adapted to receive a source of input current to the current mirror circuit;
   second electron control means having first, second and control electrodes, said first electrode being coupled to said first terminal, said control electrode being connected to said control electrode of said first electron control means;
   third electron control means having first, second and control electrodes, said first electrode being coupled to said second electrode of said second control means, said second electrode being coupled to an output terminal of the current mirror and said control electrode being coupled to said second electrode of said first electron control means; and
   a fourth electron control means having first, second, third and control electrodes, said first electrode being coupled to said control electrodes of said first and second electron control means, said second electrode being coupled to said second electrode of said third electron control means and said control and third electrodes each being coupled to said first electrode of said third electron control means.

6. The current mirror circuit of claim 5 wherein said first, second, third and fourth electron control means comprise PNP transistors.

7. The current mirror circuit of claim 6 wherein said PNP transistors being laterally formed in the integrated circuit.

8. A monolithic integrated circuit source, comprising:
   a pair of transistors each having an emitter coupled to a first terminal at which is supplied an operating potential, interconnected base electrodes and collector electrodes, said collector electrode of the first one of said pair of transistors being coupled at a second terminal to a source of input current;

an output transistor having a base, emitter and collector, said base being coupled to said second terminal, said emitter being coupled to said collector of the other one of said pair of transistors, said collector being coupled to an output terminal of the current source; and an additional transistor having an emitter, base and multi-collectors, said emitter being coupled to said interconnected base electrodes of said pair of transistors, the base and at least one of said multi-collectors being coupled to said emitter of said output transistor and one of said multi-collectors being coupled to said collector of said output transistor.

9. The current source of claim 8 wherein said transistors being PNP transistors.

10. The current source of claim 9 wherein said multi-collector transistor is formed laterally within the monolithic integrated circuit.

* * * * *